(12) United States Patent
Chi et al.

(10) Patent No.: US 8,143,097 B2
(45) Date of Patent: Mar. 27, 2012

(54) SEMICONDUCTOR DEVICE AND METHOD OF FORMING OPEN CAVITY IN TSV INTERPOSER TO CONTAIN SEMICONDUCTOR DIE IN WLCSMP

(75) Inventors: HeeJo Chi, Kyoungki-do (KR); NamJu Cho, Gyeonggi-do (KR); HanGil Shin, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 282 days.

(21) Appl. No.: 12/565,380

(22) Filed: Sep. 23, 2009

(65) Prior Publication Data
US 2011/0068444 A1 Mar. 24, 2011

(51) Int. Cl.
*H01L 21/44* (2006.01)
*H01L 21/48* (2006.01)

(52) U.S. Cl. ........ 438/107; 438/106; 438/109; 438/112; 438/124; 257/777; 257/778; 257/787

(58) Field of Classification Search .......... 438/106–109, 438/112, 124, 126, 127; 257/777–778, 787, 257/E21.705, E23.169
See application file for complete search history.

(56) References Cited

U.S. PATENT DOCUMENTS

| | | | |
|---|---|---|---|
| 5,977,640 A | 11/1999 | Bertin et al. | |
| 6,906,415 B2 | 6/2005 | Jiang et al. | |
| 6,921,968 B2 | 7/2005 | Chung | |
| 7,261,596 B2 * | 8/2007 | Akaike et al. | 439/607.01 |
| 7,745,918 B1 * | 6/2010 | Woodyard | 257/686 |
| 2008/0128882 A1 | 6/2008 | Baek et al. | |

* cited by examiner

*Primary Examiner* — Theresa T Doan
(74) *Attorney, Agent, or Firm* — Robert D. Atkins; Patent Law Group: Atkins & Associates, P.C.

(57) ABSTRACT

A semiconductor device is made by mounting a semiconductor wafer to a temporary carrier. A plurality of TSV is formed through the wafer. A cavity is formed partially through the wafer. A first semiconductor die is mounted to a second semiconductor die. The first and second die are mounted to the wafer such that the first die is disposed over the wafer and electrically connected to the TSV and the second die is disposed within the cavity. An encapsulant is deposited over the wafer and first and second die. A portion of the encapsulant is removed to expose a first surface of the first die. A portion of the wafer is removed to expose the TSV and a surface of the second die. The remaining portion of the wafer operates as a TSV interposer for the first and second die. An interconnect structure is formed over the TSV interposer.

20 Claims, 11 Drawing Sheets

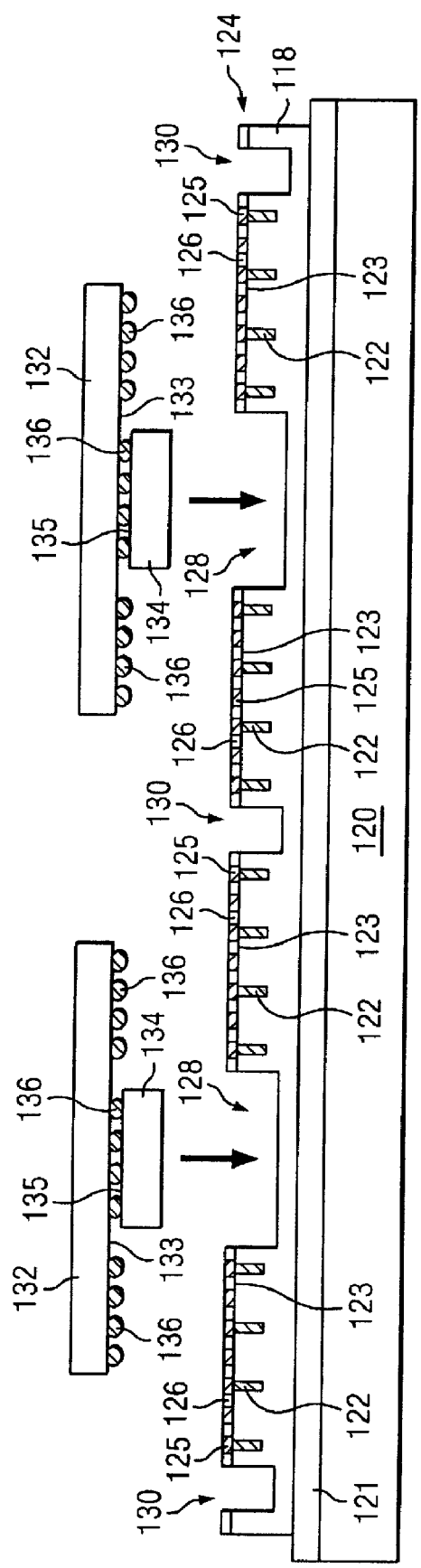
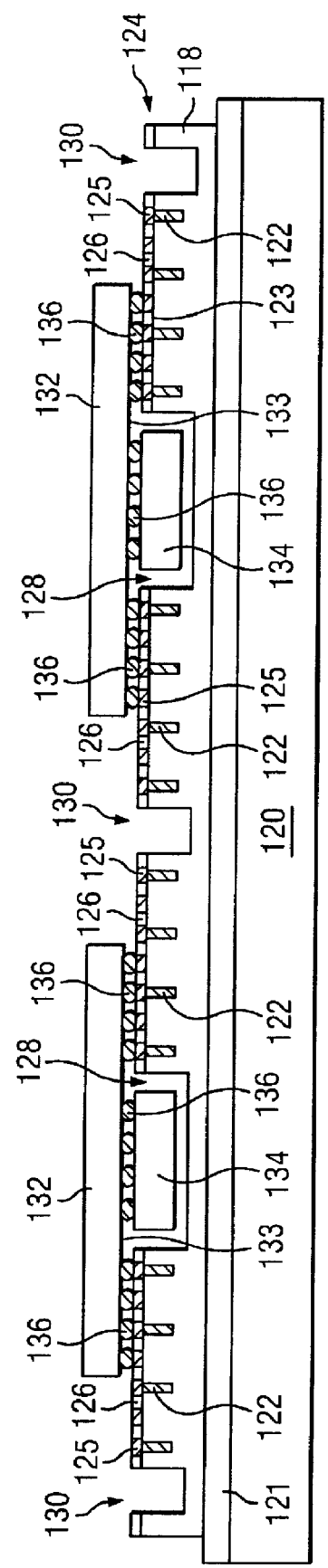
FIG. 3c
FIG. 3d

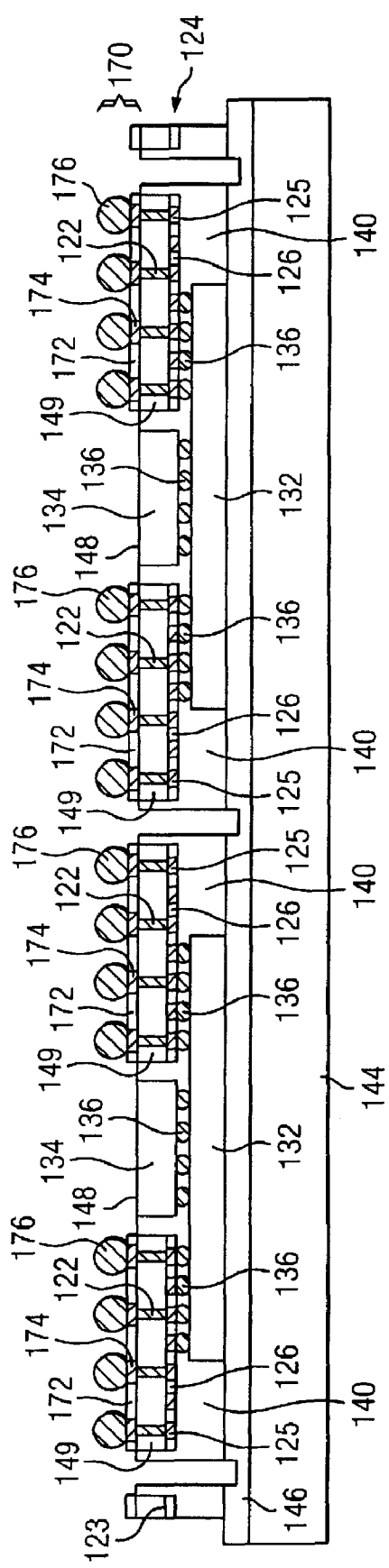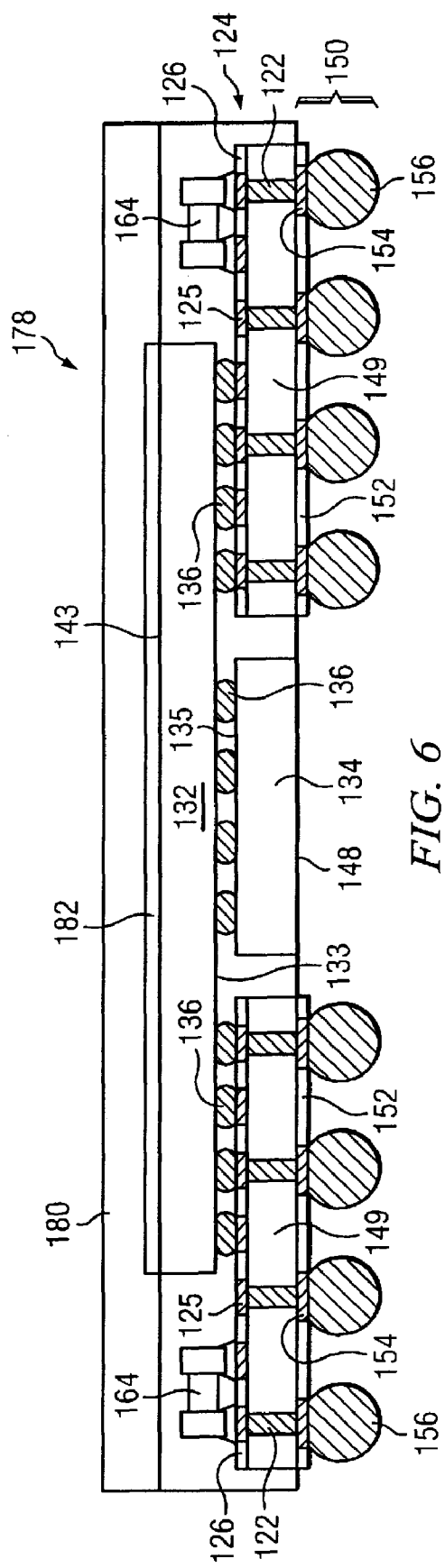
FIG. 5
FIG. 6

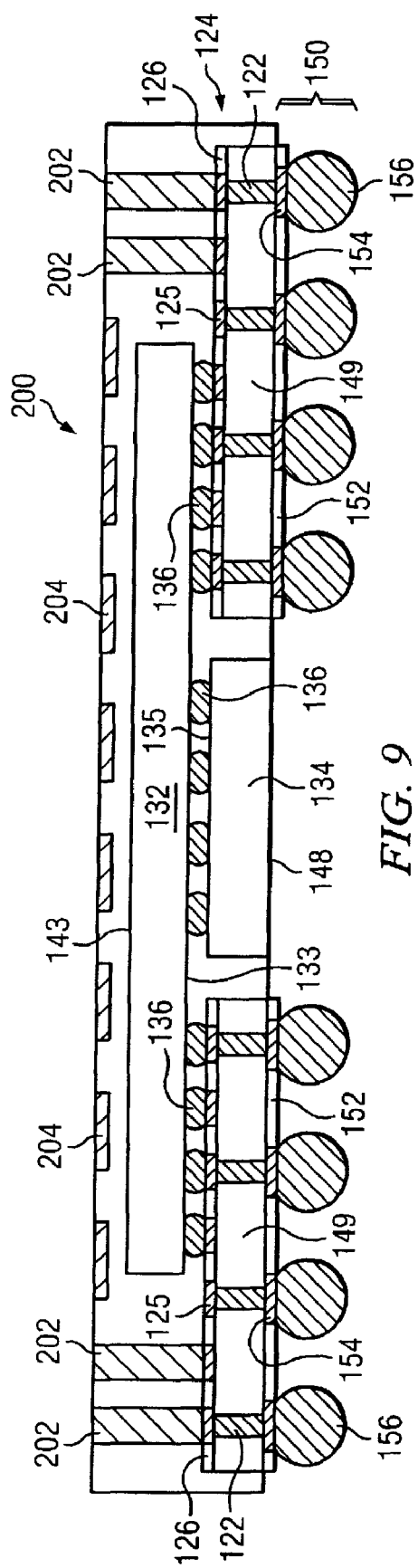
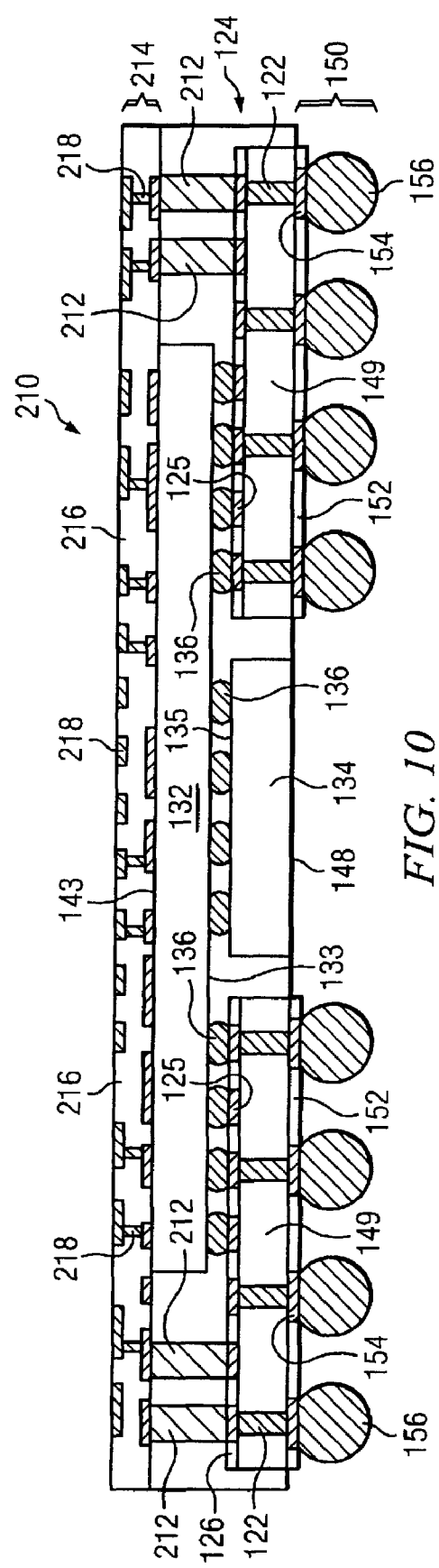
FIG. 9
FIG. 10

SEMICONDUCTOR DEVICE AND METHOD OF FORMING OPEN CAVITY IN TSV INTERPOSER TO CONTAIN SEMICONDUCTOR DIE IN WLCSMP

FIELD OF THE INVENTION

The present invention relates in general to semiconductor devices and, more particularly, to a semiconductor device and method of forming an open cavity TSV interposer to contain semiconductor die in a wafer level chip scale module package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Wafer level chip scale module packages (WLCSMP) typically contain stacked semiconductor die over and between an organic substrate or interposer for higher device integration. Examples of the WLCSMPs with upper and lower stacked semiconductor die can be found in U.S. Pat. Nos. 6,921,968, 5,977,640, and 6,906,415. The lower semiconductor die is thinner than the organic substrate and thus contained within the encapsulant. Accordingly, it is difficult to properly dissipate heat from the lower semiconductor. The fixed organic substrate requires care when handling to avoid damage to the thin semiconductor die. In addition, warpage is a recurring issue due to mismatches in the coefficient of thermal expansion (CTE) between the upper and lower semiconductor die and organic substrate.

SUMMARY OF THE INVENTION

A need exists for a thinner WLCSMP with good heat dissipation and which is robust against warpage. Accordingly, in one embodiment, the present invention is a method of making a semiconductor device comprising the steps of mounting a semiconductor wafer to a temporary carrier, forming a plurality of TSV through the semiconductor wafer, forming a cavity partially through the semiconductor wafer, mounting a first semiconductor die to a second semiconductor die, mounting the first and second semiconductor die to the semiconductor wafer such that the first semiconductor die is disposed over the semiconductor wafer and electrically connected to the TSV and the second semiconductor die is disposed within the cavity, depositing an encapsulant over the semiconductor wafer and around the first and second semiconductor die, removing a portion of the encapsulant to expose a first surface of the first semiconductor die, and removing a portion of the semiconductor wafer to expose the TSV and a first surface of the second semiconductor die. The remaining portion of the semiconductor wafer operates as a TSV interposer for the first and second semiconductor die. The method further includes the step of forming a first interconnect structure over the TSV interposer.

In another embodiment, the present invention is a method of making a semiconductor device comprising the steps of providing a semiconductor wafer, forming a plurality of conductive vias through the semiconductor wafer, forming a first cavity in the semiconductor wafer, mounting a first semiconductor die to a second semiconductor die, mounting the first and second semiconductor die to the semiconductor wafer such that the first semiconductor die is disposed over the semiconductor wafer and electrically connected to the conductive vias and the second semiconductor die is disposed within the first cavity, depositing an encapsulant over the semiconductor wafer and around the first and second semiconductor die, and removing a portion of the semiconductor wafer to expose the conductive vias and a first surface of the second semiconductor die. The remaining portion of the semiconductor wafer operates as an interposer for the first and second semiconductor die. The method further includes the step of forming a first interconnect structure over the interposer.

In another embodiment, the present invention is a method of making a semiconductor device comprising the steps of providing a semiconductor wafer, forming a plurality of conductive vias through the semiconductor wafer, forming a cavity in the semiconductor wafer, mounting a first semiconductor die to a second semiconductor die, mounting the first and second semiconductor die to the semiconductor wafer such that the first semiconductor die is disposed over the semiconductor wafer and electrically connected to the conductive vias and the second semiconductor die is disposed within the cavity, depositing an encapsulant over the semiconductor wafer and first and second semiconductor die, and removing a portion of the semiconductor wafer to expose the conductive vias and a first surface of the second semiconductor die. The remaining portion of the semiconductor wafer operates as an interposer for the first and second semiconductor die.

In another embodiment, the present invention is a semiconductor device comprising an interposer having a plurality of conductive vias formed through the interposer and cavity formed in the interposer. A first semiconductor die is mounted to the interposer. A second semiconductor die is mounted to the first semiconductor die and disposed within the cavity. An encapsulant is deposited over the interposer and first and second semiconductor die. A first surface of the first semiconductor die is exposed from the encapsulant and a first surface of the second semiconductor die is exposed from the encapsulant. A first interconnect structure is formed over the interposer.

BRIEF DESCRIPTION OF THE DRAWINGS

FIGS. 3a-3i illustrate a process of forming a WLCSMP having an open cavity for containing a semiconductor die and interconnected through a TSV interposer;

FIG. 5 illustrates the TSV interposer with a polymer insulating layer;

FIG. 6 illustrates the WLCSMP with a heat spreader and TIM layer formed over the upper semiconductor die;

FIG. 9 illustrates the WLCSMP with conductive pillars formed through the encapsulant and conductive layer formed over the encapsulant;

FIG. 10 illustrates the WLCSMP with conductive pillars formed through the encapsulant and interconnect structure formed over the upper semiconductor die;

DETAILED DESCRIPTION OF THE DRAWINGS

Figure 1:
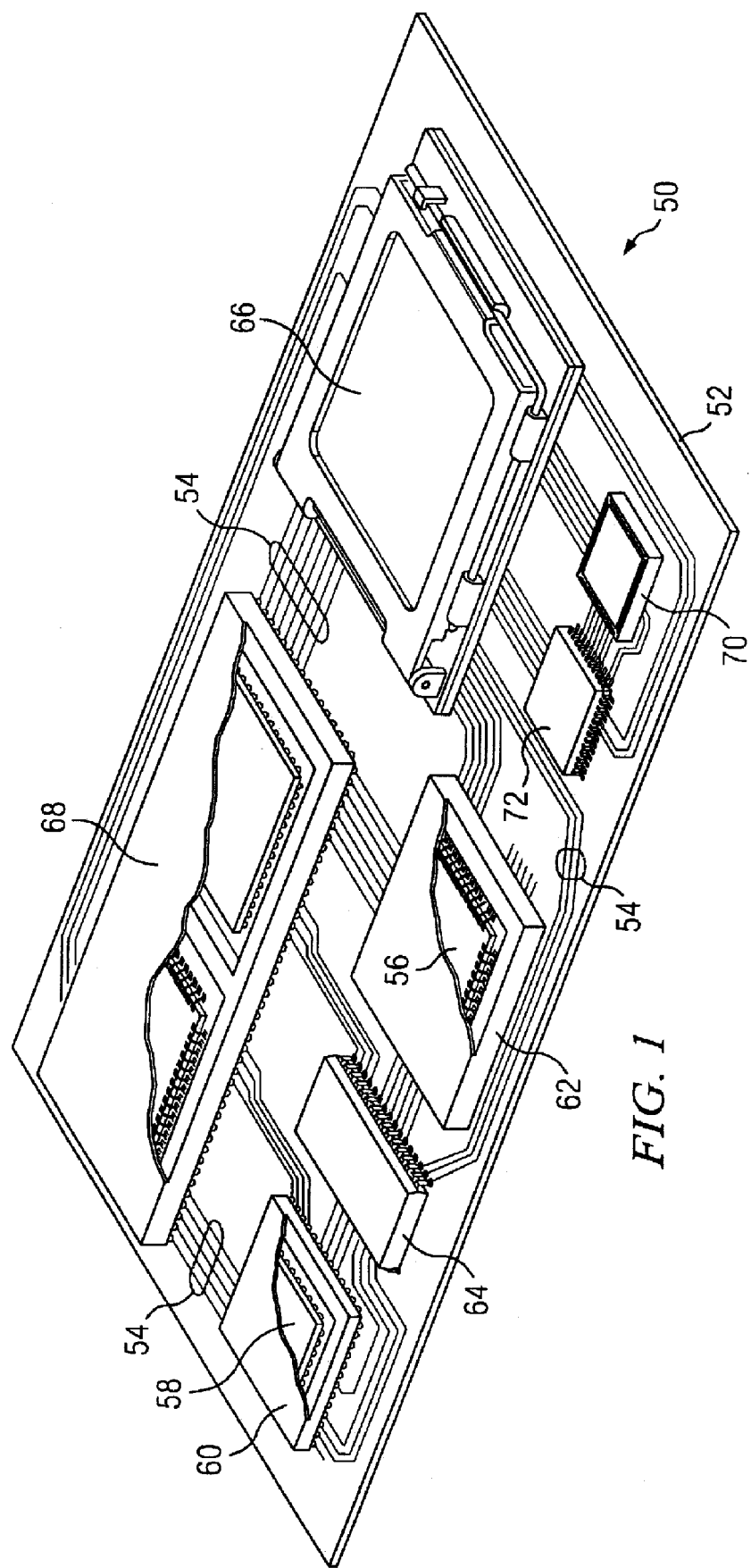
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
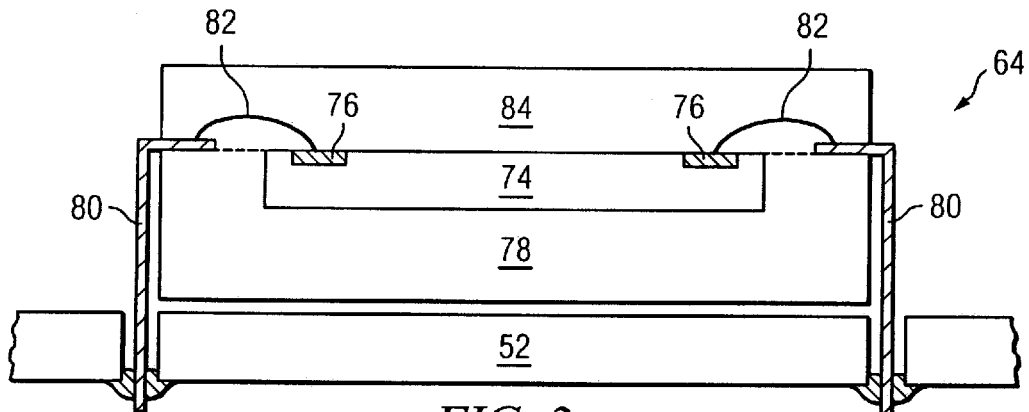
FIGS. 2a-2c illustrate further detail of the representative semiconductor packages mounted to the PCB.
Figure 2B:
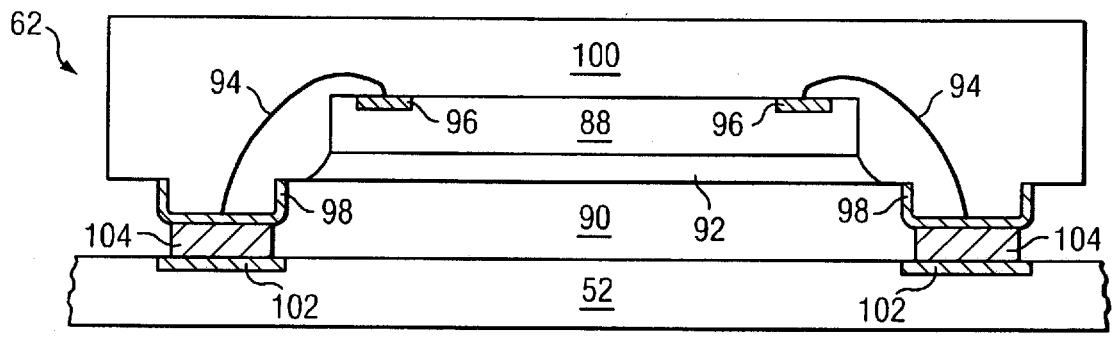
Figure 2C:
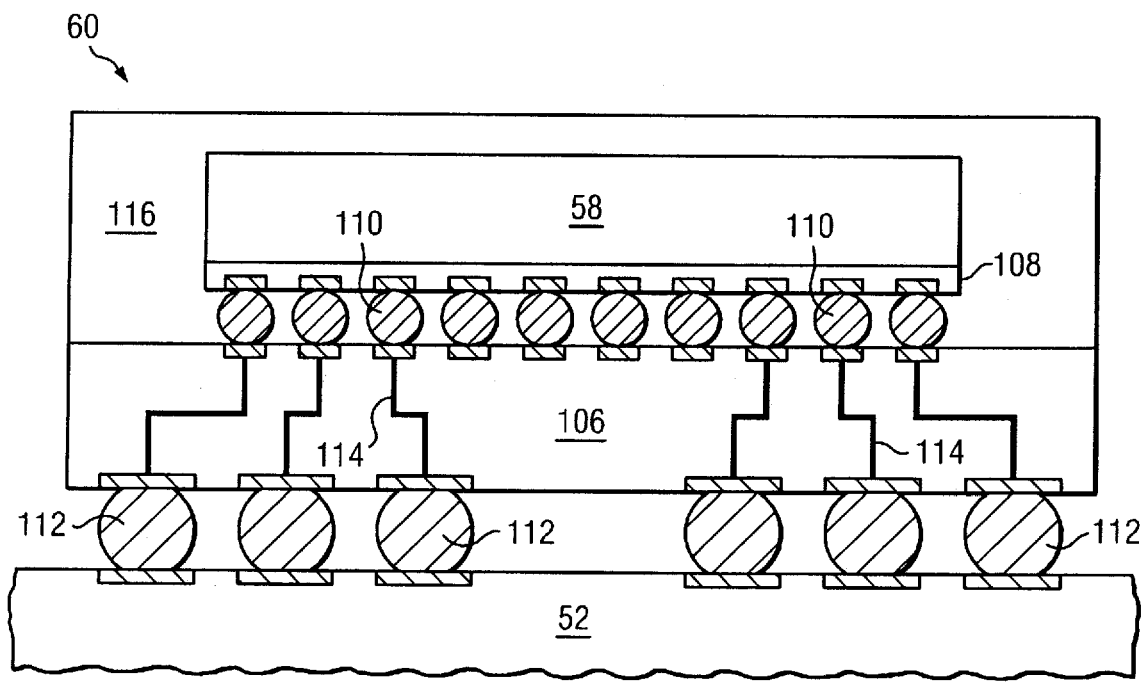

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
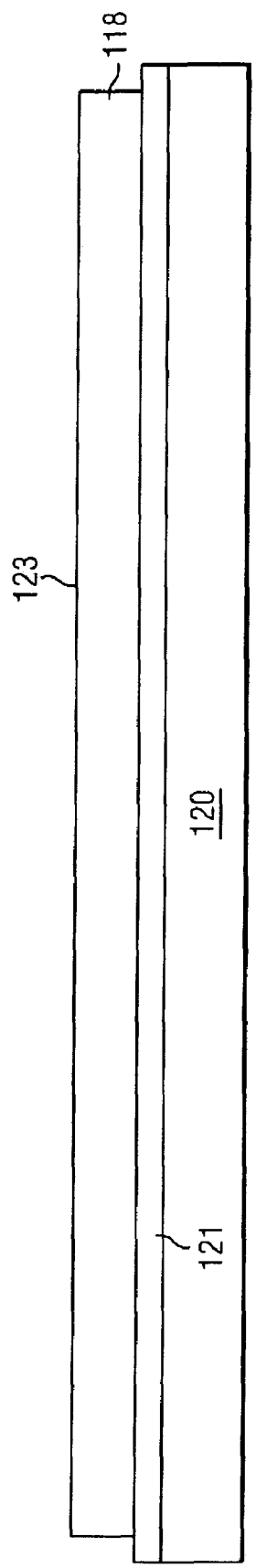

FIGS. 3*a*-3*i* illustrate, in relation to FIGS. 1 and 2*a*-2*c*, a process of forming a WLCSMP having an open cavity for containing a semiconductor die and interconnected through TSV interposer. FIG. 3*a* shows a semiconductor wafer 118 containing a base substrate material such as silicon, germanium, gallium arsenide, indium phosphide, or silicon carbide, for structural support. A substrate or carrier 120 contains temporary or sacrificial base material such as silicon, polymer, polymer composite, metal, ceramic, glass, glass epoxy, beryllium oxide, or other suitable low-cost, rigid material or bulk semiconductor material for structural support. An interface layer or tape 121 is applied over carrier 120 as a temporary adhesive bonding film or etch-stop layer. Semiconductor wafer 118 is mounted to carrier tape 121 with surface 123 oriented away from the tape.

Figure 3B:
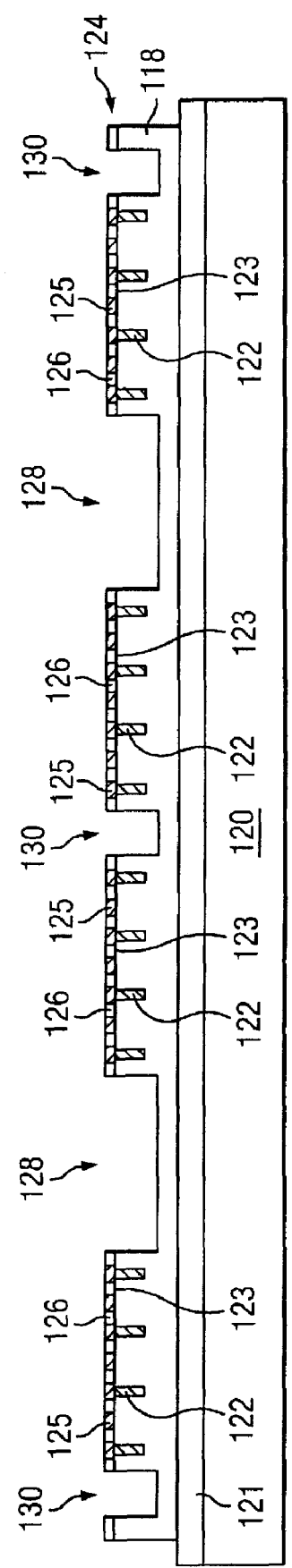

In FIG. 3*b*, a plurality of vias is formed from surface 123 partially through semiconductor wafer 118 using laser drilling or etching process, such as deep reactive ion etching (DRIE). The vias are filled with Al, Cu, Sn, Ni, Au, Ag, titanium (Ti), W, poly-silicon, or other suitable electrically conductive material using PVD, CVD, electrolytic plating, electroless plating, or other suitable metal deposition process to form conductive through silicon vias (TSV) 122. An optional insulating layer can be formed around TSV 122. A circuit layer 124 is formed over surface 123 of semiconductor wafer 118. Circuit layer 124 contains an electrically conductive layer 125 separated by insulating layer 126. The insulating layer 126 can be one or more layers of silicon dioxide (SiO2), silicon nitride (Si3N4), silicon oxynitride (SiON), tantalum pentoxide (Ta2O5), aluminum oxide (Al2O3), photoresist, or other material having similar insulating and structural properties. The insulating layer 126 is formed using PVD, CVD, printing, spin coating, spray coating, sintering or thermal oxidation. A portion of insulating layer 126 is removed by an etching process. Conductive layer 125 is formed in the removed portions of insulating layer 126 using patterning with PVD, CVD, sputtering, electrolytic plating, electroless plating, or other suitable metal deposition process. Conductive layer 125 can be one or more layers of Al, Cu, Sn, Ni, Au, Ag, or other suitable electrically conductive material. One portion of conductive layer 125 is electrically connected to TSV 122. Other portions of conductive layer 125 can be electrically common or electrically isolated depending on the design and function of the semiconductor device. One or more integrated passive devices (IPD), such as inductors, capacitors, and resistors, can be formed in circuit layer 124 for RF signal processing.

A trench 128 is formed from surface 123 partially through semiconductor wafer 118 with sufficient width and depth to contain a semiconductor die. Trench 128 can be formed with saw blade, laser drilling, or DRIE. In one embodiment, trench 128 has a width greater than an x/y axis length of semiconductor die 134 and depth greater than a thickness of semiconductor die 134. An optional trench 130 is formed from surface 123 partially through semiconductor wafer 118 for dicing saw space. Trench 130 allows the sides of semiconductor wafer 118 (later referred to as TSV interposer) to be covered by encapsulant after singulation.

FIG. 3*c* shows a semiconductor die or component 132 having an active surface 133 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 133 to implement analog circuits or digital circuits, such as digital signal processor (DSP), ASIC, memory, or other signal processing circuit. Semiconductor die 132 may also contain IPD, such as inductors, capacitors, and resistors, for RF signal processing.

An electrically conductive bump material is deposited over active surface 133 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is reflowed by heating the material above its melting point to form spherical balls or bumps 136. Bumps 136 represent one type of interconnect structure that can be formed over active surface 133. The interconnect structure can also use stud bumps, micro bumps, conductive pillars, conductive paste, or other electrical interconnect.

A semiconductor die or component 134 is mounted and electrically connected to semiconductor die 132 using bumps 136. Semiconductor die 134 has an active surface 135 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 135 to implement analog circuits or digital circuits, such as DSP, ASIC, memory, or other signal processing circuit. Semiconductor die 134 may also contain IPD, such as inductors, capacitors, and resistors, for RF signal processing.

The combined semiconductor die 132-134 are positioned over semiconductor wafer 118 and aligned to place semiconductor die 134 over trench 128. The combined semiconductor die 132-134 are then mounted to semiconductor wafer 118 by reflowing bumps 136 to metallurgically and electrically connect active surface 133 to conductive layer 125, as shown in FIG. 3*d*. Semiconductor die 134 is contained within trench 128 to reduce the package height.

Figure 3E:
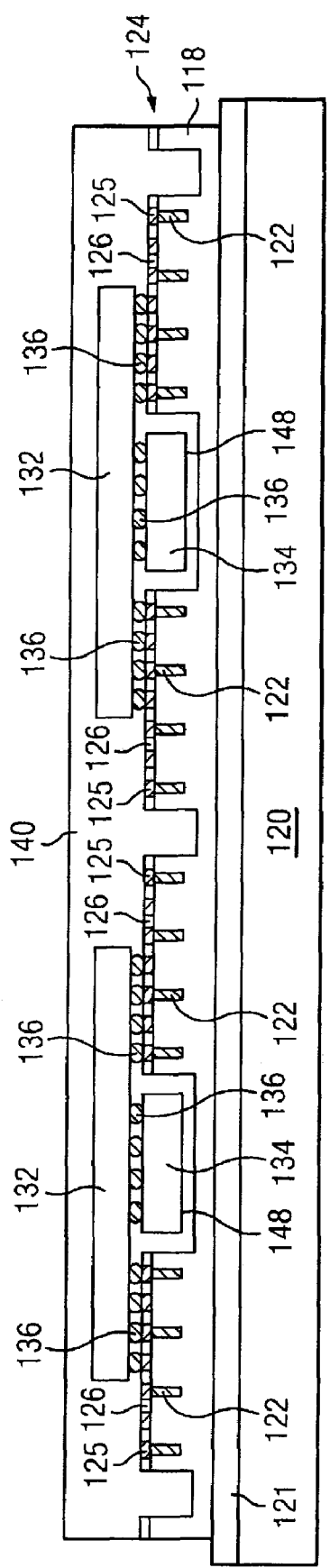

In FIG. 3*e*, an encapsulant or molding compound 140 is deposited over semiconductor wafer 118 and around semiconductor die 132 and 134 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive and environmentally protects the semiconductor device from external elements and contaminants.

Figure 3F:
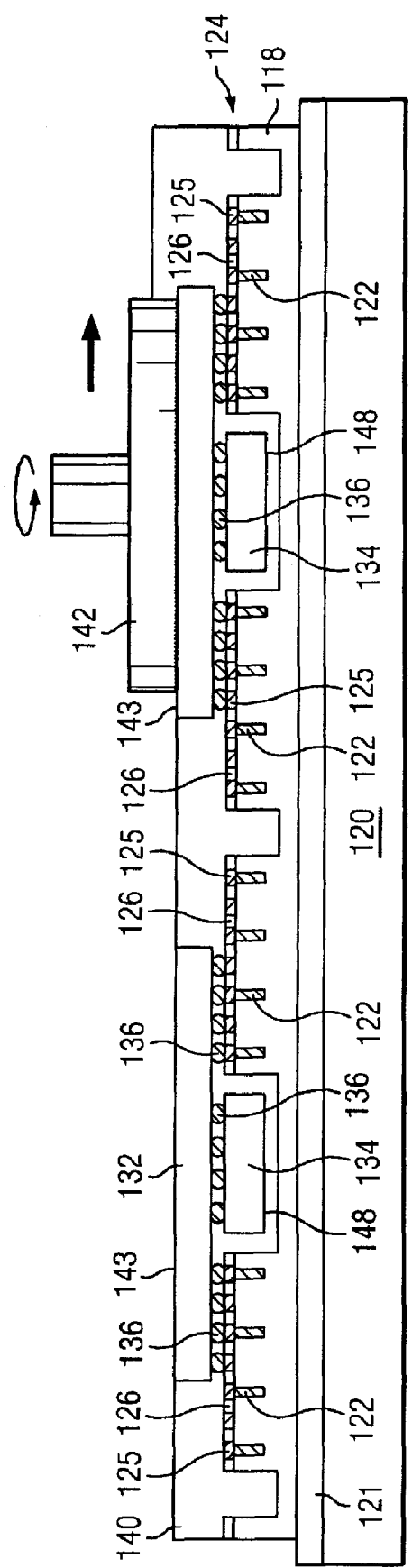

In FIG. 3*f*, a portion of encapsulant 140 is removed by grinding wheel 142 to expose a back surface 143 of semiconductor die 132 and reduce the height of the package. In another embodiment, such as described in FIG. 9, grinding wheel 142 can leave a portion of encapsulant 140 covering surface 143 of semiconductor die 132.

Figure 3G:
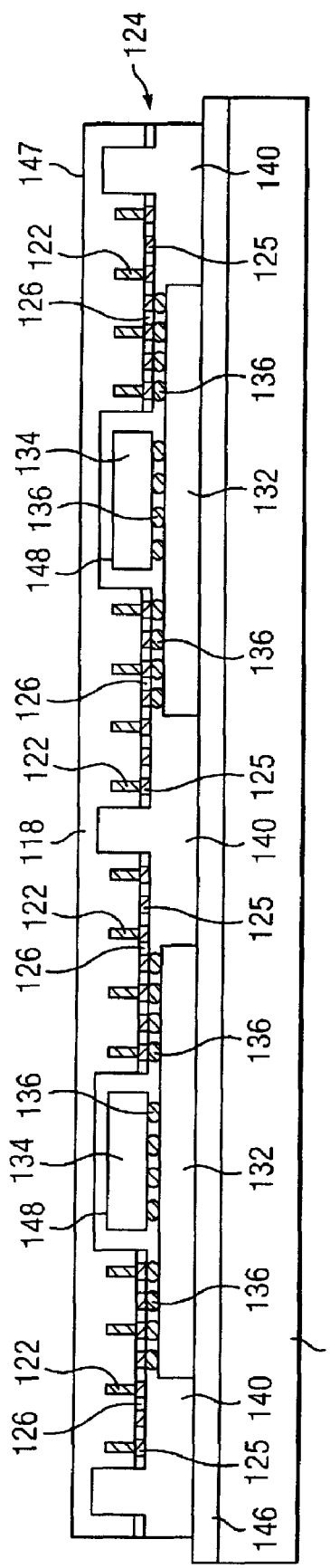

In FIG. 3*g*, a substrate or carrier 144 contains temporary or sacrificial base material such as silicon, polymer, polymer composite, metal, ceramic, glass, glass epoxy, beryllium oxide, or other suitable low-cost, rigid material or bulk semiconductor material for structural support. An interface layer or tape 146 is applied over carrier 144 as a temporary adhesive bonding film or etch-stop layer. The assembly described in FIGS. 3*a*-3*f* is inverted and mounted to carrier tape 146. The carrier 120 and tape 121 are removed by chemical etching, mechanical peel-off, CMP, mechanical grinding, thermal bake, laser scanning, or wet stripping.

Figure 3H:
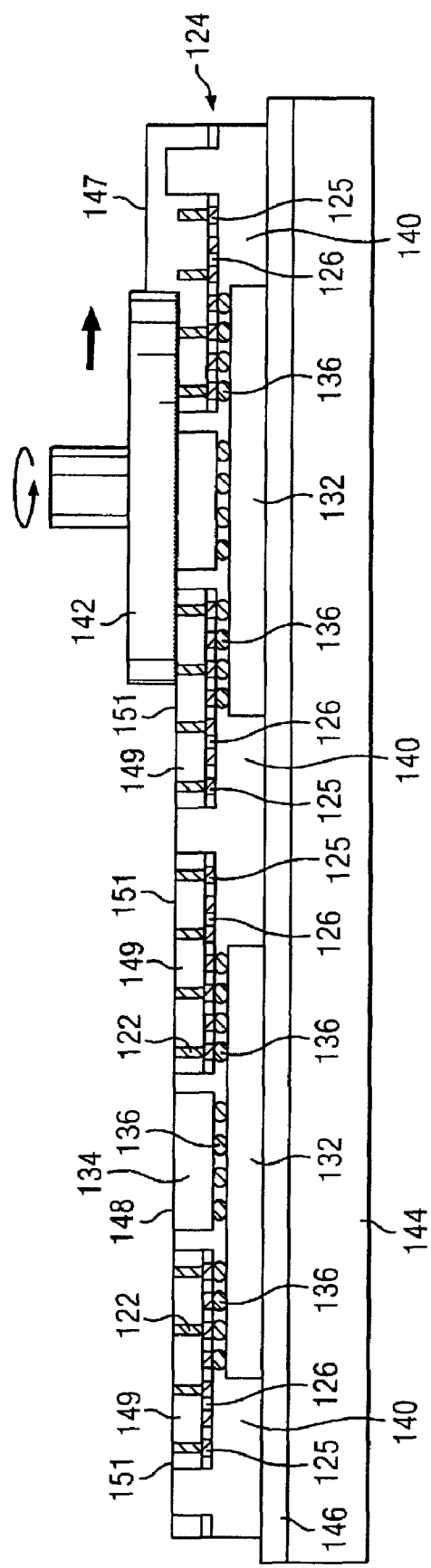

In FIG. 3h, a portion of surface 147 of semiconductor wafer 118, opposite surface 123, is removed by grinding wheel 142 to expose TSV 122 and back surface 148 of semiconductor die 134 and reduce the height of the package. The remaining portion of semiconductor wafer 118 constitutes interposer 149 having TSV 122 for electrical interconnect.

Figure 3I:
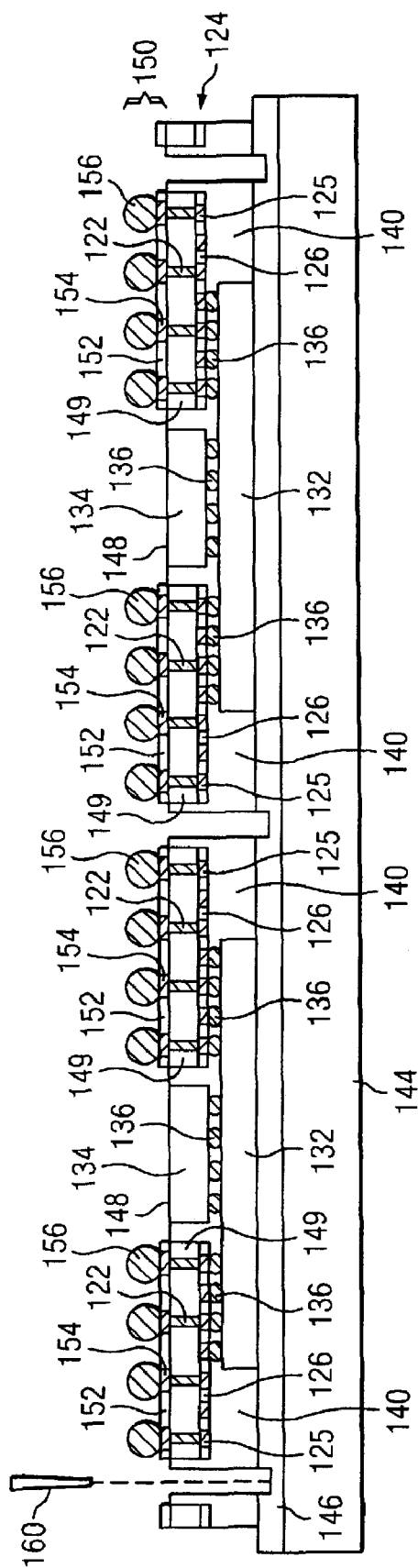

In FIG. 3i, an interconnect structure 150 is formed over surface 151 of interposer 149. The interconnect structure 150 includes an insulating or passivation layer 152 formed over surface 151 as using PVD, CVD, printing, spin coating, spray coating, sintering or thermal oxidation. The insulating layer 152 can be one or more layers of SiO2, Si3N4, SiON, Ta2O5, Al2O3, or other material having similar insulating and structural properties. A portion of insulating layer 152 is removed by an etching process to expose TSV 122.

An electrically conductive layer 154 is formed over TSV 122 and the removed portion of insulating layer 152 using a patterning and deposition process such as PVD, CVD, sputtering, electrolytic plating, and electroless plating. Conductive layer 154 can be one or more layers of Al, Cu, Sn, Ni, Au, Ag, or other suitable electrically conductive material. An under bump metallization (UBM) layer can be formed over conductive layer 154. One portion of conductive layer 154 is electrically connected to TSV 122 and circuit layer 124. Other portions of conductive layer 154 can be electrically common or electrically isolated depending on the design and function of the semiconductor device.

An electrically conductive bump material is deposited over build-up interconnect structure 150 and electrically connected to conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 156. In some applications, bumps 156 are reflowed a second time to improve electrical contact to conductive layer 154. The bumps can also be compression bonded to conductive layer 154. Bumps 156 represent one type of interconnect structure that can be formed over conductive layer 154. The interconnect structure can also use stud bumps, micro bumps, conductive pillars, conductive paste, or other electrical interconnect.

Figure 4:
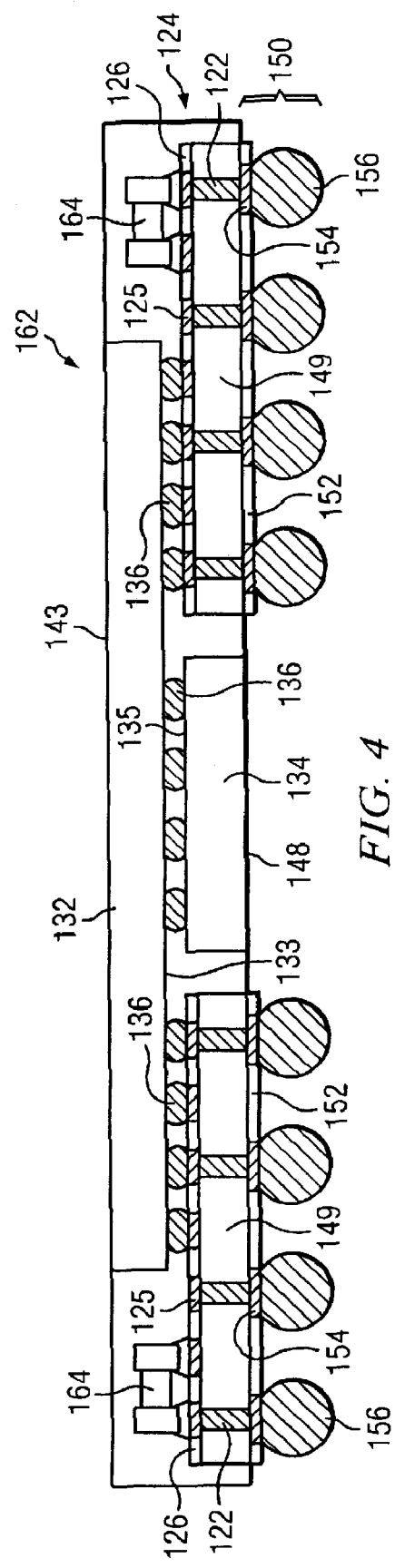
FIG. 4 illustrates the WLCSMP with an open cavity containing the semiconductor die and interconnected through the TSV interposer.

The carrier 144 and tape 146 are removed by chemical etching, mechanical peel-off, CMP, mechanical grinding, thermal bake, laser scanning, or wet stripping. Semiconductor die 132 and 134 are singulated with saw blade or laser cutting device 160 into individual WLCSMP. FIG. 4 shows WLCSMP 162 after singulation. Passive components 164, such as resistor, capacitor, inductor, or active component, are mounted to interposer 149. Semiconductor die 134 is electrically connected to semiconductor die 132 through bumps 136. Semiconductor die 132 is electrically connected through circuit layer 124 and interposer 149 containing TSV 122 to interconnect structure 150. The WLCSMP 162 has an open cavity for containing semiconductor die 134 to reduce the height of the package. The grinding process also reduces the height of WLCSMP 162. In one embodiment, the sides of interposer 149 are covered by encapsulant 140 due to the extra dicing space provided by trench 130. Alternatively, without trench 130, the sides of interposer 149 can be exposed. The exposed surface 143 of semiconductor die 132 and exposed surface 148 of semiconductor die 134 provide for good heat dissipation. The similar base material of semiconductor die 132 and 134 and interposer 149, e.g., silicon, provides thermal stress relief and makes WLCSMP 162 robust against any mismatch in CTE between the components of the package. Accordingly, WLCSMP 162 has reduced occurrence of warpage.

In a variation of the above process, after FIG. 3h, an interconnect structure 170 is formed over surface 151 of interposer 149, as shown in FIG. 5. The interconnect structure 170 includes a polymer insulating layer 172 formed over surface 151 using spin coating, film lamination, molding, or other suitable deposition process. Polymer insulating layer 172 can be one or more layers of polyimide, benzocyclobutene (BCB), polybenzoxazoles (PBO), or other material having similar insulating and structural properties. A portion of polymer insulating layer 172 is removed by an etching process to expose TSV 122.

An electrically conductive layer 174 is formed over TSV 122 and the removed portion of polymer insulating layer 172 using a patterning and deposition process such as PVD, CVD, sputtering, electrolytic plating, and electroless plating. Conductive layer 174 can be one or more layers of Al, Cu, Sn, Ni, Au, Ag, or other suitable electrically conductive material. One portion of conductive layer 174 is electrically connected to TSV 122 and circuit layer 124. Other portions of conductive layer 174 can be electrically common or electrically isolated depending on the design and function of the semiconductor device.

An electrically conductive bump material is deposited over build-up interconnect structure 170 and electrically connected to conductive layer 174 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 174 using a suitable attachment or bonding process. In one embodiment, the bump material is reflowed by heating the material above its melting point to form spherical balls or bumps 176. In some applications, bumps 176 are reflowed a second time to improve electrical contact to conductive layer 174. The bumps can also be compression bonded to conductive layer 174. Bumps 176 represent one type of interconnect structure that can be formed over conductive layer 174. The interconnect structure can also use stud bumps, micro bumps, conductive pillars, conductive paste, or other electrical interconnect.

FIG. 6 shows WLCSMP 178 including the features described in FIGS. 3a-3i, 4 and metal plate 180 mounted to surface 143 of semiconductor die 132 and encapsulant 140 with thermally conductive adhesive. Metal plate 180 can also be formed by electroless or electroplating process. Metal plate 180 operates as a heat spreader to dissipate thermal energy from WLCSMP 178. Metal plate 180 can be Al, Cu, or another material with high thermal conductivity. An optional die attach adhesive or thermal interface layer (TIM) 182 secures metal plate 180 to semiconductor die 132 and encapsulant 140. Metal plate 180 increases the rigidity of WLCSMP 178.

Figure 7:
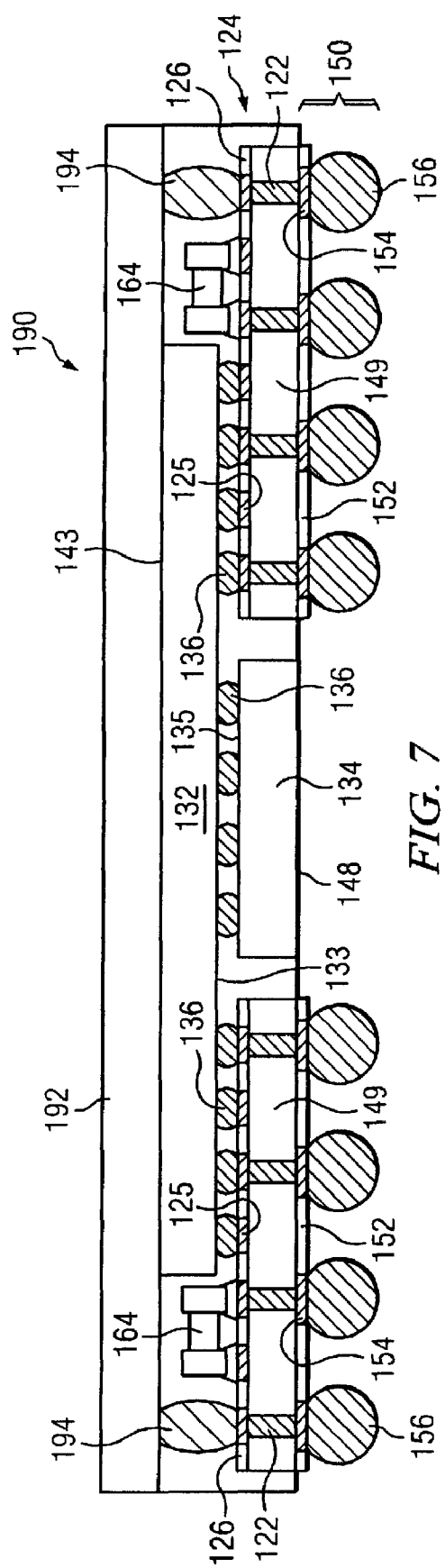
FIG. 7 illustrates the WLCSMP with an EMI and RFI shielding layer formed over the upper semiconductor die.

FIG. 7 shows WLCSMP 190 including the features described in FIGS. 3a-3i, 4 and metal plate 192 mounted to surface 143 of semiconductor die 132 and encapsulant 140 with an adhesive. Metal plate 192 can also be formed by electroless or electroplating process. Metal plate 192 operates as an electromagnetic interference (EMI) or radio frequency interference (RFI) shielding layer. Metal plate 192 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. The shielding layer can also be a non-metal material such as carbon-black or aluminum flake to reduce the effects of EMI and RFI. Metal plate 192 is grounded through conductive pillars or studs 194, circuit layer 124, TSV 122 in interposer 149, and interconnect structure 150. Conductive pillars 194 can be Au studs, or Cu pillars, or solder. Metal plate 192 also operates as a heat spreader to dissipate thermal energy from WLCSMP 190.

Figure 8:
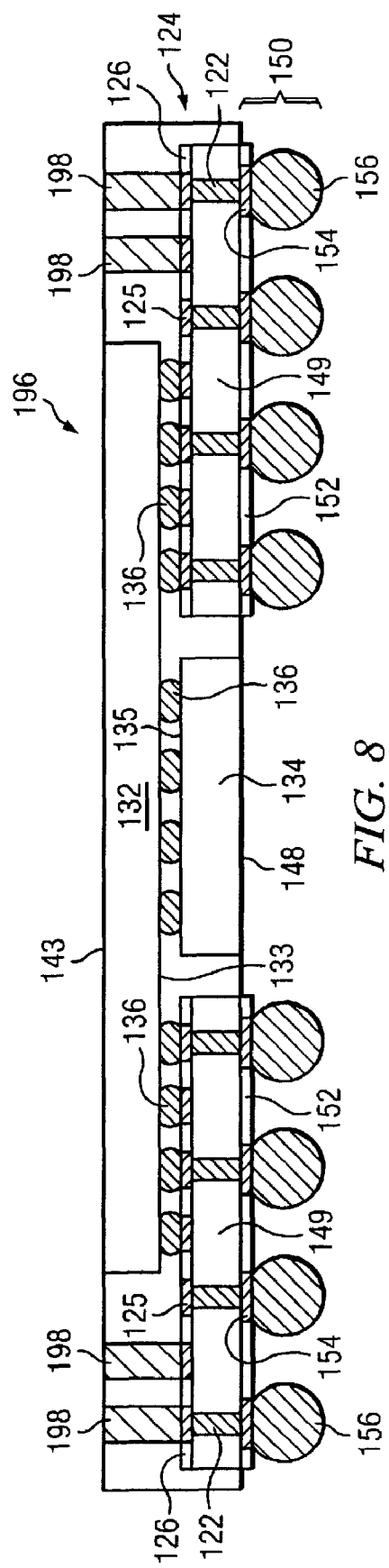
FIG. 8 illustrates the WLCSMP with conductive pillars formed through the encapsulant.

FIG. 8 shows WLCSMP 196 including the features described in FIGS. 3a-3i, 4 and conductive pillars or studs 198 formed in encapsulant 140. Conductive pillars 198 can be formed by laser drilling or etching vias in encapsulant 140 and filling the vias with conductive material, such as Cu, Au, or solder. Conductive pillars 198 provide additional interconnect capability for stacking semiconductor packages.

FIG. 9 shows WLCSMP 200 including the features described in FIGS. 3a-3i and 4, with the exception that the grinding operation described in FIG. 3f leaves encapsulant 140 covering surface 143 of semiconductor die 132. Conductive pillars or studs 202 can be formed by laser drilling or etching vias in encapsulant 140 and filling the vias with conductive material, such as Cu, Au, or solder. Conductive layer 204 is formed in encapsulant 140. Conductive pillars 202 and conductive layer 204 provide additional interconnect capability for fan-in stacking semiconductor packages.

FIG. 10 shows WLCSMP 210 including the features described in FIGS. 3a-3i and 4. In addition, conductive pillars or studs 212 can be formed by laser drilling or etching vias in encapsulant 140 and filling the vias with conductive material, such as Cu, Au, or solder. An interconnect structure 214 is formed over surface 143 of semiconductor die 132 and encapsulant 140. The interconnect structure 214 includes an insulating or passivation layer 216 formed using PVD, CVD, printing, spin coating, spray coating, sintering or thermal oxidation. The insulating layer 216 can be one or more layers of SiO2, Si3N4, SiON, Ta2O5, Al2O3, or other material having similar insulating and structural properties. An electrically conductive layer 218 is formed in insulating layer 216 using a patterning and deposition process such as PVD, CVD, sputtering, electrolytic plating, and electroless plating. Conductive layer 218 can be one or more layers of Al, Cu, Sn, Ni, Au, Ag, or other suitable electrically conductive material. One portion of conductive layer 218 is electrically connected to conductive pillars 212. Other portions of conductive layer 218 can be electrically common or electrically isolated depending on the design and function of the semiconductor device. Conductive pillars 212 and interconnect structure 214 provide additional interconnect capability for fan-in stacking semiconductor packages.

Figure 11:
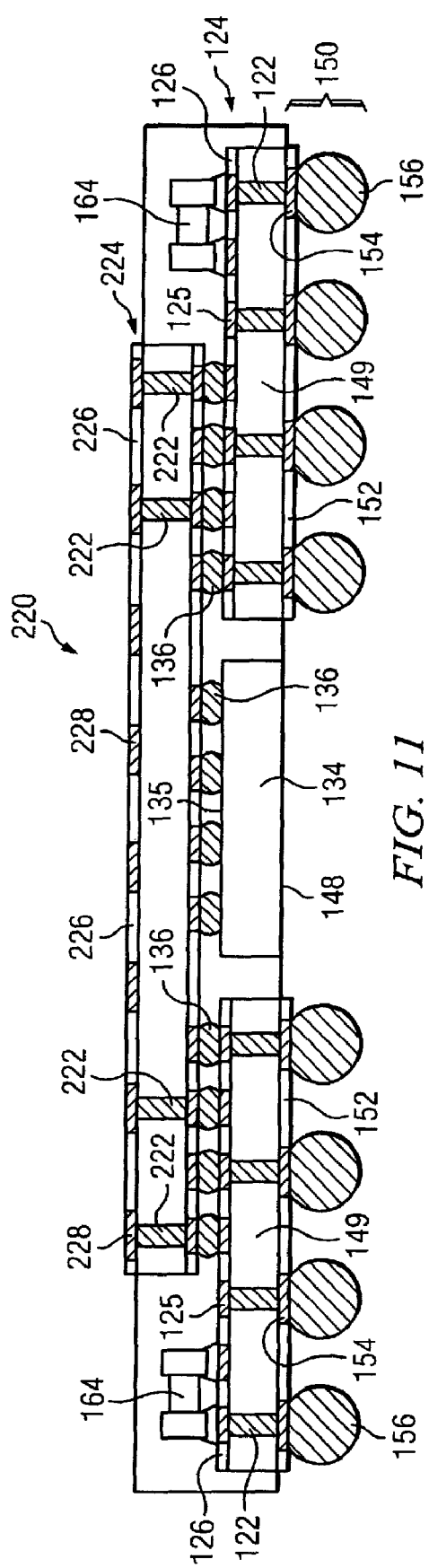
FIG. 11 illustrates the WLCSMP with TSV formed through the upper semiconductor die and interconnect structure formed over the upper semiconductor die.

FIG. 11 shows WLCSMP 220 including the features described in FIGS. 3a-3i and 4. In addition, conductive pillars 222 can be formed by laser drilling or etching vias in semiconductor die 132 and filling the vias with conductive material, such as Cu or Au. An interconnect structure 224 is formed over surface 143 of semiconductor die 132. The interconnect structure 224 includes an insulating or passivation layer 226 formed using PVD, CVD, printing, spin coating, spray coating, sintering or thermal oxidation. The insulating layer 226 can be one or more layers of SiO2, Si3N4, SiON, Ta2O5, Al2O3, or other material having similar insulating and structural properties. A portion of insulating layer 226 is removed by an etching process. An electrically conductive layer 228 is formed in the removed portion of insulating layer 226 using a patterning and deposition process such as PVD, CVD, sputtering, electrolytic plating, and electroless plating. Conductive layer 228 can be one or more layers of Al, Cu, Sn, Ni, Au, Ag, or other suitable electrically conductive material. Conductive pillars 222 and conductive layer 226 provide additional interconnect capability for stacking semiconductor packages.

Figure 12:
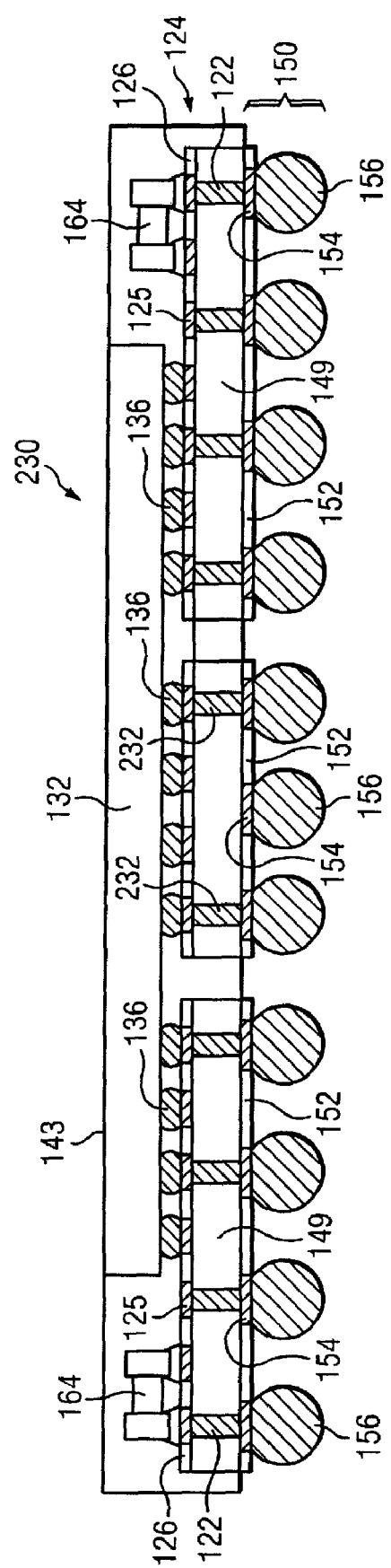
FIG. 12 illustrates the WLCSMP with TSV formed through the lower semiconductor die and interconnect structure formed over the lower semiconductor die.

FIG. 12 shows WLCSMP 230 including the features described in FIGS. 3a-3i and 4. In addition, conductive pillars 232 can be formed by laser drilling or etching vias in semiconductor die 134 and filling the vias with conductive material, such as Cu or Au. The interconnect structure 150 is extended over surface 148 of semiconductor die 134. Conductive pillars 232 and interconnect structure 150 over surface 158 of semiconductor die 134 provide additional interconnect capability for stacking semiconductor packages.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   mounting a semiconductor wafer to a temporary carrier;
   forming a plurality of through silicon vias (TSV) through the semiconductor wafer;
   forming a cavity partially through the semiconductor wafer;
   mounting a first semiconductor die to a second semiconductor die;
   mounting the first and second semiconductor die to the semiconductor wafer such that the first semiconductor die is disposed over the semiconductor wafer and electrically connected to the TSV and the second semiconductor die is disposed within the cavity;
   depositing an encapsulant over the semiconductor wafer and around the first and second semiconductor die;
   removing a portion of the encapsulant to expose a first surface of the first semiconductor die;
   removing a portion of the semiconductor wafer to expose the TSV and a first surface of the second semiconductor die, the remaining portion of the semiconductor wafer operating as a TSV interposer for the first and second semiconductor die; and
   forming a first interconnect structure over the TSV interposer.

2. The method of claim 1, wherein the exposed first surface of the first semiconductor die and exposed first surface of the second semiconductor die provide for heat dissipation.

3. The method of claim 1, wherein the first and second semiconductor die and TSV interposer are made with similar material to provide thermal stress relief.

4. The method of claim 1, further including forming a metal plate over the first surface of the first semiconductor die for heat dissipation.

5. The method of claim 1, further including forming a shielding layer over the first surface of the first semiconductor die against electromagnetic interference.

6. The method of claim 1, further including forming a plurality of conductive pillars through the encapsulant around the first semiconductor die.

7. The method of claim 1, further including forming a second interconnect structure over the first surface of the first semiconductor die.

8. A method of manufacturing a semiconductor device, comprising:

providing a semiconductor wafer;
forming a plurality of conductive vias through the semiconductor wafer;
forming a first cavity in the semiconductor wafer;
mounting a first semiconductor die to a second semiconductor die;
mounting the first and second semiconductor die to the semiconductor wafer such that the first semiconductor die is disposed over the semiconductor wafer and electrically connected to the conductive vias and the second semiconductor die is disposed within the first cavity;
depositing an encapsulant over the semiconductor wafer and around the first and second semiconductor die;
removing a portion of the semiconductor wafer to expose the conductive vias and a first surface of the second semiconductor die, the remaining portion of the semiconductor wafer operating as an interposer for the first and second semiconductor die; and
forming a first interconnect structure over the interposer.

9. The method of claim 8, further including forming a second cavity in the semiconductor for singulation of the semiconductor wafer, the second cavity leaving the encapsulant on the sides of the interposer after singulation.

10. The method of claim 8, further including:
forming a plurality of conductive pillars through the encapsulant around the first semiconductor die; and
forming a conductive layer in the encapsulant.

11. The method of claim 8, further including removing a portion of the encapsulant to expose a first surface of the first semiconductor die.

12. The method of claim 8, further including forming a plurality of conductive vias through the second semiconductor die.

13. The method of claim 8, further including forming a metal plate over the first surface of the first semiconductor die.

14. The method of claim 8, further including forming a second interconnect structure over the first surface of the first semiconductor die.

15. A method of manufacturing a semiconductor device, comprising:
providing a semiconductor wafer;
forming a plurality of conductive vias through the semiconductor wafer;
forming a cavity in the semiconductor wafer;
mounting a first semiconductor die to a second semiconductor die;
mounting the first and second semiconductor die to the semiconductor wafer such that the first semiconductor die is disposed over the semiconductor wafer and electrically connected to the conductive vias and the second semiconductor die is disposed within the cavity;
depositing an encapsulant over the semiconductor wafer and first and second semiconductor die; and
removing a portion of the semiconductor wafer to expose the conductive vias and a first surface of the second semiconductor die, the remaining portion of the semiconductor wafer operating as an interposer for the first and second semiconductor die.

16. The method of claim 15, further including forming a first interconnect structure over the interposer.

17. The method of claim 15, further including removing a portion of the encapsulant to expose a first surface of the first semiconductor die.

18. The method of claim 15, further including forming a plurality of conductive pillars through the encapsulant around the first semiconductor die.

19. The method of claim 15, further including forming a metal plate over the first surface of the first semiconductor die.

20. The method of claim 15, further including forming a second interconnect structure over the first surface of the first semiconductor die.

* * * * *